United States Patent [19]

Siebold

[11] Patent Number: 4,467,282

[45] Date of Patent: Aug. 21, 1984

[54] HIGH-FREQUENCY MAGNET SYSTEM FOR NUCLEAR SPIN TOMOGRAPHY

[75] Inventor: Horst Siebold, Erlangen, Fed. Rep. of Germany

[73] Assignee: Siemens Aktiengesellschaft, Munich, Fed. Rep. of Germany

[21] Appl. No.: 401,344

[22] Filed: Jul. 23, 1982

[30] Foreign Application Priority Data

Aug. 12, 1981 [DE] Fed. Rep. of Germany ....... 3131946

[51] Int. Cl.³ ............................................. G01R 33/08
[52] U.S. Cl. ..................................... 324/309; 324/318
[58] Field of Search ...................... 350/378; 313/154; 324/318–320, 322, 309

[56] References Cited

U.S. PATENT DOCUMENTS

| | | | |
|---|---|---|---|
| 3,287,630 | 11/1966 | Gang | 324/320 |
| 3,488,561 | 1/1970 | Anderson | 324/320 |
| 4,300,096 | 11/1981 | Harrison | 324/309 |
| 4,339,718 | 7/1982 | Bull | 324/319 |

FOREIGN PATENT DOCUMENTS 21535 1/1981 European Pat. Off. .
2840178 3/1980 Fed. Rep. of Germany .

Primary Examiner—Michael J. Tokar
Attorney, Agent, or Firm—Kenyon & Kenyon

[57] ABSTRACT

A magnet system for generating a high-frequency field in an image-generating apparatus of the type which utilizes nuclear magnetic resonance technology, such as zeugmatography. The magnet system contains a pair of magnet coils which are arranged on an imaginary cylindrical surface and which generate a substantially homogeneous high-frequency field which is oriented radially with respect to an axis of the imaginary cylinder. A relatively large signal-to-noise ratio is achieved by utilizing frequencies of, for example, 20 MHz. The magnet system is further provided with at least a second pair of magnet coils which is arranged on at least one imaginary cylindrical surface, and rotated in the circumferential direction. The second pair of magnet coils receives a high-frequency current which is shifted in phase by a predetermined phase angle with respect to the current flowing through the first coil pair; the currents having substantially equal amplitudes. In this manner, a circularly polarized high-frequency field is produced.

6 Claims, 8 Drawing Figures

HIGH-FREQUENCY MAGNET SYSTEM FOR NUCLEAR SPIN TOMOGRAPHY

BACKGROUND OF THE INVENTION

This invention relates generally to magnet systems for generating high-frequency fields, and more particularly, to a high-frequency magnet system for use in an image-producing apparatus which operates under the principles of nuclear magnetic resonance technology, such as zeugmatography, and which uses a pair of magnet coils which are arranged on an imaginary cylindrical surface for generating an essentially homogeneous high-frequency magnet field in a direction which is radial with respect to the axis of the imaginary cylindrical surface.

In the field of medical diagnostics, imaging methods have been proposed wherein an image which is similar to an X-ray tomogram is constructed from the spatial spin density and/or relaxation time distribution by using either numerical or measurement analysis of integrated proton resonance signals. A system for practicing such zeugmatography, or nuclear spin tomography, is described in the publication "Nature," volume 242, 1973, pages 190–191.

Nuclear magnetic resonance is applied by placing the body to be examined in a strong, homogeneous magnetic field which, as noted above, extends in a direction which is radial with respect to the axis of the imaginary cylindrical surface on which the magnet coils are arranged. One such magnet system is described in European patent application EP 21 535 A1. The magnetic field which is produced by such a magnet system serves as a base field, which, with respect to the body to be examined, will be assumed to be oriented in the z-direction in an x, y, and z coordinate system. Stationary and/or pulsed gradient fields are superimposed on the base field, which shall be designated $B_{OZ}$. In addition, an alternating high-frequency field must be provided and arranged perpendicular to the base field. This alternating high-frequency field should be as homogeneous as possible. The alternating time-variable high-frequency field is represented by $B_1 = B_{X} e_{X} \cos \Omega t$, and is oriented, for example, in the x-direction so as to have an amplitude $B_X$ in the direction of the unit vector $e_X$. This alternating magnet field serves to tilt the nuclear spin magnetization of the body to be examined, which may be human, from the z-direction to the x-y plane. The x, y, component of the magnetization so produced precesses about the z-axis and induces in a pickup coil which is aligned in the x or y direction an electric signal which is amplified and evaluated. Instead of a separate pickup coil, the high-frequency exciter coil can also be provided for detection. Only the component which rotates in the same sense as the spin precession is physically effective for exciting the nuclear spin magnetization.

In zeugmatography, the signal-to-noise ratio of the signal induced in the pickup coil increases with the base field $B_O = 2\pi f/\gamma$, where f is the corresponding precession frequency of the nuclear spin, and $\gamma$ is the gyromagnetic factor of the protons. For protons, for example, this factor is $\gamma = 2\pi \cdot 42.57$ MHz/Tesla. Since the quality of the pictures produced depends on the signal-to-noise ratio, it is desirable to obtain base fields $B_{OZ}$ as high as possible and thereby high-frequencies $F = \gamma B_{OZ}/2\pi$, as described in J. Phys. E.:Sci. Instrum., vol. 13, 1980, pages 38–44. In known zeugmatographic equipment, such as that described hereinabove in EP 21 535 A1, only relatively low frequencies of about 5 MHz can be provided for physical reasons, because at higher frequencies, eddy currents are observed which are induced in the electrically conductive material of the body to be examined. In this respect, tissues of live biological bodies having a conductivity $$\delta = 0.5[\text{ohm} \cdot \text{m}]^{-1}$$

of can be considered as electrically conductive. The eddy currents weaken the high-frequency field in the interior of the body because of the skin effect, and render the field nonhomogeneous. Thus, it is a problem with the known systems that the signal-to-noise ratio cannot be increased by raising the frequency of operation of the known systems for determining nuclear spin resonance.

It is, therefore, an object of this invention to provide an image-generating system which utilizes nuclear magnetic resonance technology of the type mentioned herein in such a manner that a relatively large signal-to-noise ratio is achieved, thereby enabling the use of high frequencies, illustratively 20 MHz.

SUMMARY OF THE INVENTION

The foregoing and other objects are achieved by this invention which provides a second pair of magnet coils, the magnet coils of the first and second pair being arranged in the circumferential direction on at least one imaginary cylindrical surface. Moreover, a circularly polarized high-frequency field is produced by means of a high-frequency current in the second coil pair which is phase shifted by a predetermined phase angle with respect to the high-frequency current in the first coil pair. The amplitudes of the two high-frequency currents are approximately equal.

One advantage which is achieved by the inventive magnet system is that the circularly polarized high-frequency field exhibits an improved penetration characteristic into the body to be examined over the penetration which is provided in the known devices. This results from the fact that the drop in the field strength is substantially smaller at frequencies of illustratively 20 MHz for a circularly polarized field, than for a directional linearly polarized field. Thus, high frequencies in this order of magnitude can be provided so that the signal-to-noise ratio of the apparatus is correspondingly high.

In a further exemplary embodiment of the invention, the magnet coils of each magnet coil pair are arranged so as to be formed in the shape of a saddle. One pair of the magnet coils may be arranged on the inside surface of a hollow cylindrical carrier body, and the magnet coils of the other coil pair is arranged on the outside surface of the carrier body. In one embodiment, the adjacent saddle-shaped magnet coils from different magnet coil pairs have, on the sides which face one another, common straight conductor sections which extend in the direction of the axis of the cylinder.

BRIEF DESCRIPTION OF THE DRAWINGS

Comprehension of the invention is facilitated by reading the following detailed description in conjunction with the annexed drawings, in which.

DETAILED DESCRIPTION

The magnet system of the present invention is especially suited for zeugmatography, and is based upon known magnet coil arrangements such as those which are disclosed in DE-OS No. 28 40 178 and EP No. 21 535 A1. The present magnet coil arrangement has a field coil, which may be of a superconducting type, which is concentrically arranged with respect to the z-axis of an orthogonal x, y, z coordinate system for generating a homogeneous magnet base field in the z-direction. The coil arrangement is also provided with gradient coils for generating a sufficiently constant magnetic field gradient. The magnet coil arrangement permits axial access to the homogeneous field region at its center. Thus, for example, a human body to be examined is placed in the magnetic field along the z-axis. The nuclear spin is excited by means of a high-frequency field which is directed to be perpendicular to the z-axis of the coils which are mounted on at least one central carrier body. These coils may also serve as receiving coils for receiving the nuclear resonance signals. Alternatively, a similar configuration of coils must be provided as the receiving system concentrically inside or outside of the coil carrier body. The gradient coils, as well as the high-frequency coils, extend around the body to be examined in the region of the field coil system.

Figure 1:
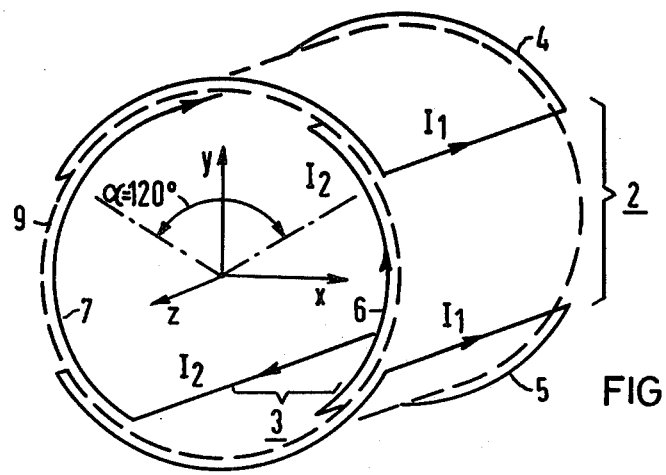
FIG. 1 is a schematic representation of a magnet system constructed in accordance with the principles of the invention.

FIG. 1 is a schematic representation of a magnet system which is constructed in accordance with the principles of the invention, and presented in an oblique view. The magnet system shown in FIG. 1 generates a high-frequency field using two pairs 2 and 3 of coils. Each such pair of coils contains coil 4 and 5, and 6 and 7, respectively. Coils 4 and 5 of coil pair 2 are arranged on the outside of a carrier body 9 which is indicated by a dashed line in the figure. Coils 6 and 7 of coil pair 3 are arranged inside of the carrier body. Carrier body 9 is configured in the form of a hollow cylinder having an axis in the z-direction of an orthogonal x, y, and z coordinate system. Magnet coils 4, 5, 6, and 7 are saddle-shaped such that each has an aperture angle $\alpha$ of 120° in the x-y plane. Coils 4 and 5, and 6 and 7, respectively, of each coil pair are arranged diametrically with respect to each other on the outer and inner cylindrical surfaces, respectively, of carrier cylinder 9. Coil pair 2 is rotated 90° in the circumferential direction with respect to coil pair 3. In this manner, the respective coils of the coil pairs overlap at their edge regions.

In accordance with the invention, coils 4 and 5 of coil pair 2 are supplied with a high-frequency current $I_1$ which is phase-shifted by a phase angle of 90° with respect to a current $I_2$ which flows through coils 6 and 7 of second coil pair 3. The amplitudes of currents $I_1$ and $I_2$ are approximately equal to one another. Thus, a circularly polarized high-frequency field which is essentially homogeneous is generated in the interior of carrier cylinder 9.

Figure 2:
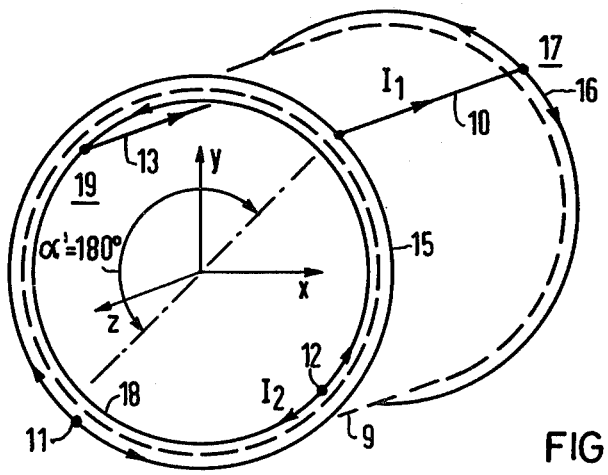
FIG. 2 is a schematic representation of a further magnet system constructed in accordance with the principles of the invention.

FIG. 2 shows a further magnet system constructed in accordance with the principles of the invention, and which is easier to produce than the magnet system of FIG. 1. The system of FIG. 1 can be derived from the magnet system of FIG. 1 by enlarging the aperture angle of $\alpha$ from 120° to $\alpha' = 180°$. Thus, the straight conductor sections which are parallel to the z-direction and are adjacent to one another, of the saddle coils of the coil pairs can be combined in common conductor sections 10, 11, and 12, 13. An additional conductor ring is required for each coil pair at the end faces. In the oblique presentation of FIG. 2, only two conductor rings 15 and 16 of first coil pair 17, as well as a conductor ring 18 of second coil pair 19, are visible. The directions of flow of currents $I_1$ and $I_2$ in the individual coil pairs are indicated by arrows in the lines which represent their conductors. Current $I_1$ is shifted in phase by 90° with respect to current $I_2$. It is an advantage of this magnet system that it is characterized by a lower ohmic resistance than the magnet system of FIG. 1, and therefore has an correspondingly higher Q. In addition, the conductors in coil pairs 17 and 19 have only four crossings if the two coil pairs are mounted on the outside surface of cylinder 9 which supports them. In contrast thereto, eight crossings are obtained with the outside mounting in the magnet system of FIG. 1.

Figure 3:
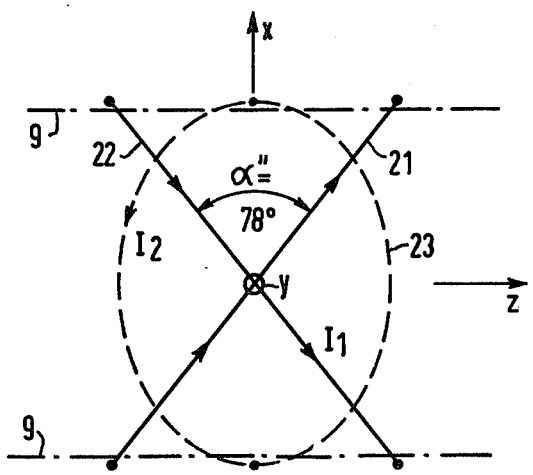
FIG. 3 shows an embodiment of the invention wherein the magnet system has an elliptical shape.

The present invention is not limited to the cylindrical configurations shown in FIGS. 1 and 2. The coils of the coil pairs may be configured in other geometrical shapes, such as crossed ellipses, as shown in FIG. 3. FIG. 3 is a schematic representation which is viewed in the direction of the y-axis of an orthogonal x, y, z coordinate system. A carrier cylinder 9, similar to that used in the previously described embodiments, is indicated by dash-dotted lines which indicate its outside surface. The axis of carrier cylinder 9 is parallel to the z-direction. In this embodiment, a pair of elliptical coils 21 and 22 are arranged to cross one another. The aperture, or crossing angle $\alpha''$ between the coils is approximately 78°. An additional coil pair which is rotated by 90° with respect to the z-axis is required to be arranged on the inside surface of carrier cylinder 9 to generate the circularly polarized high-frequency field. The coils of this coil pair are indicated in the top view of the figure by a broken line 23. The direction of flow of current $I_1$ and $I_2$ in the two coil pairs is indicated by arrows, the currents being shifted with respect to one another by 90°, as noted hereinabove.

In the inventive magnet system embodiments shown in FIGS. 1, 2, and 3, it is assumed that one or more concentric cylindrical surfaces are provided by the two coil pairs arranged so as to be rotated by 90° in the circumferential direction with respect to one another to form the circularly polarized high-frequency field, in the absence of a conducting body. As noted, the currents in the two coil pairs is shifted in phase by 90° with respect to one another. However, it is also possible to generate a high-frequency field using a larger number of coil pairs. In such a situation, the phase angle of the respective coil currents must be correspondingly reduced.

Figure 4:
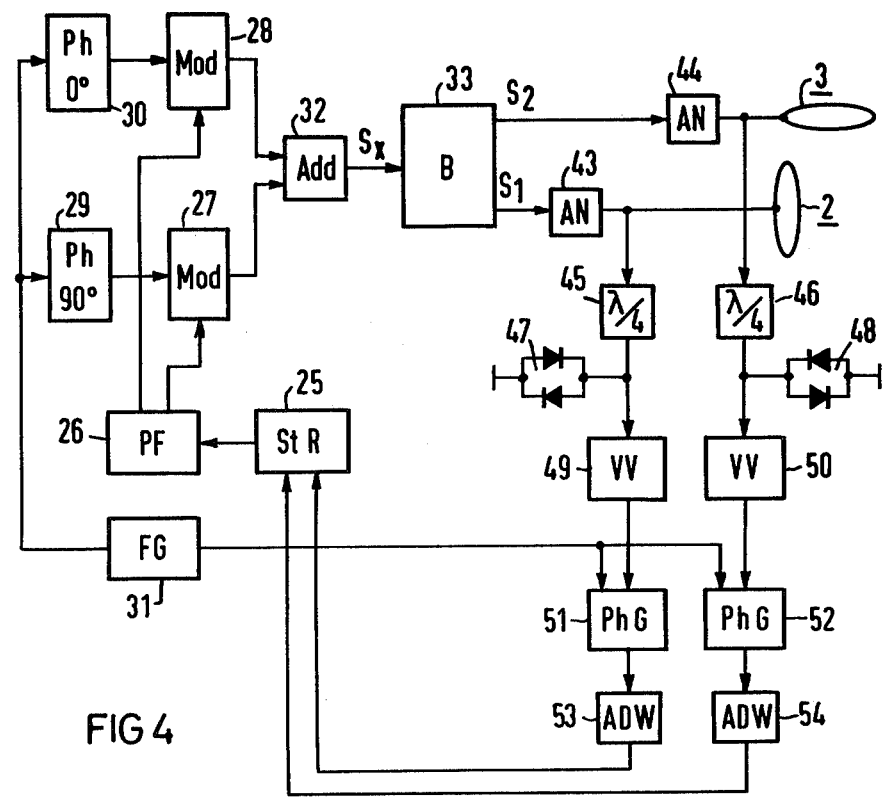
FIG. 4 is a block and schematic representation of an image-generating system constructed in accordance with the principles of the invention.

FIG. 4 is a block and schematic representation of the essential elements of an image-generating apparatus which is particularly useful in zeugmatography. This figure shows the image-generating system connected to a magnet system according to the invention for generating a high-frequency field. A control computer 25 controls the overall cycle of the arrangement. Control computer 25 controls a pulse former 26 which generates pulse-enveloping modulation signals for a paid of single-sideband modulators 27 and 28. Single-sideband modulators 27 and 28 receive phase-shifted signals from a pair of phase-shifters 30 which are supplied with a fundamental frequency from a highly stable frequency generator 31. The output signals from single-sideband modulators 27 and 28 are combined in an adder 32 which provides a high-frquency signal $S_X$. As noted above, the inventive magnet system requires the generation of two feed currents which are shifted in phase with respect to each other by 90°. Such phase-shifted signals can be produced by a circuit 33, alternative embodiments of which are discussed in detail with respect to FIGS. 5 and 6.

Figure 5:
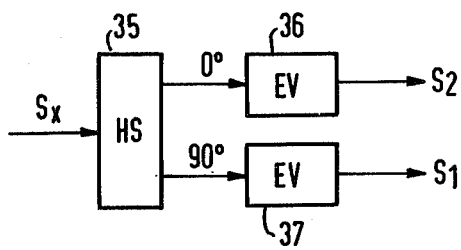
FIGS. 5 and 6 are alternative circuits which can be included in the embodiment of FIG. 4 for providing signals which are shifted in phase with respect to one another.

FIG. 5 shows in greater detail an embodiment of a circuit for producing phase-shifted signals, the circuit being suitable for incorporation in the structure of FIG. 4 as circuit 33. According to FIG. 5, the high-frequency drive signal $S_X$ is resolved in a hybrid circuit 35 into two phase-shifted components which are amplified by respective output amplifiers 36 and 37. Output amplifiers 36 and 37 produce at their respective outputs two phase-shifted signals $S_1$ and $S_2$.

Figure 6:
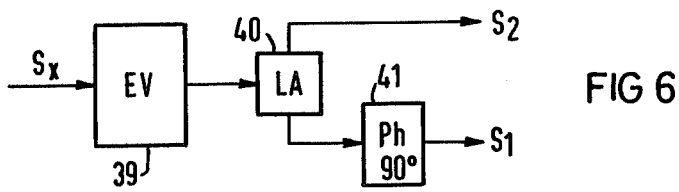

FIG. 6 shows a circuit embodiment which is an alternative to the circuit described in FIG. 5. In FIG. 6, the high-frequency drive signal $S_X$ is amplified in an output amplifier 39 which must be designed to operate at twice the power of output amplifiers 36 and 37 in FIG. 5. The output of output amplifier 39 is connected to a power divider 40 so as to produce at one output thereof a signal which corresponds to signal $S_2$ in FIG. 5. The other output terminal of power divider 40 is connected to a phase shifter 41 which produces at its output the signal $S_1$. The embodiments of FIGS. 5 and 6 each require the same total output amplifier power. Such total output amplifier power, however, is only one-half of the power which is required in a single frequency coil pair of the type used in the known arrangements.

Referring to FIG. 4, power signals $S_1$ and $S_2$ are delivered from circuit 33 to a pair of matching networks 43 and 44. Matching networks 43 and 44 are connected to magnet coil pairs 2 and 3 which are tuned to resonance. The coil pairs are also used as receiving coils whereby the high-frequency signal is improved by a factor of 2, and the signal-to-noise ratio is improved by a factor $\sqrt{2}$. In addition, matching networks 43 and 44 are connected to a pair of respective quarter-wave lines ($\lambda/4$) 45 and 46 which are connected to their outputs to diode terminations 47 and 48. The quarter-wave lines serve as self-controlled double-throw switches for switching from transmitting to receiving operations. During the transmitting operation, the diodes are switched into conduction as a result of the high voltages and, since they appear as short-circuits, they act as power reflectors. However, the diodes appear to have high resistance when they receive the weak signals. The received signals are amplified by a pair of respective preamplifiers 49 and 50. Preamplifiers 49 and 50 are coupled at their outputs to a respective pair of phase-sensitive rectifiers 51 and 52 which receive reference signals from frequency generator 31. The signals at the outputs of phase sensitive rectifiers 51 and 52 are conducted to control computer 25 via respective analog-to-digital converters 53 and 54. Such digitized signals can then be processed further in control computer 25 in a known manner.

In an embodiment of the invention which is different from those described with respect to FIGS. 4, 5, and 6, a phase shift of a signal line, illustratively from coil 3 to diode switch 48, may be produced by a phase shifter which is similar to phase shifter 29. Such structure may be provided instead of separate amplifiers 49 and 50. The signal which is so phase-shifted is added to the signal of coil 2 via an adder which may be similar to adder 32, discussed hereinabove. In this manner, only a single preamplifier 49 and a phase-sensitive rectifier 51 are required for the sum signal.

If a body, illustratively a human body to be examined, is considered as an approximation of a nonmagnetic homogeneous conducting cylinder, to which cylinder coordinates z, r, and $\phi$ are assigned, the field in the interior of the body is no longer homogeneous, as is well known. Such an internal field is a function of cylinder coordinates r and $\phi$. Further, only the component of the high-frequency field which rotates in the same sense as the spin precession is physically effective for exciting the nuclear spin magnetization, while the components rotating in the opposite direction remains ineffective. The curves of FIG. 7 illustrate, for one one embodiment, the radial dependents of the effective rotating component of the high-frequency field wherein an exciting field is linearly polarized in the x-direction.

Figure 7:
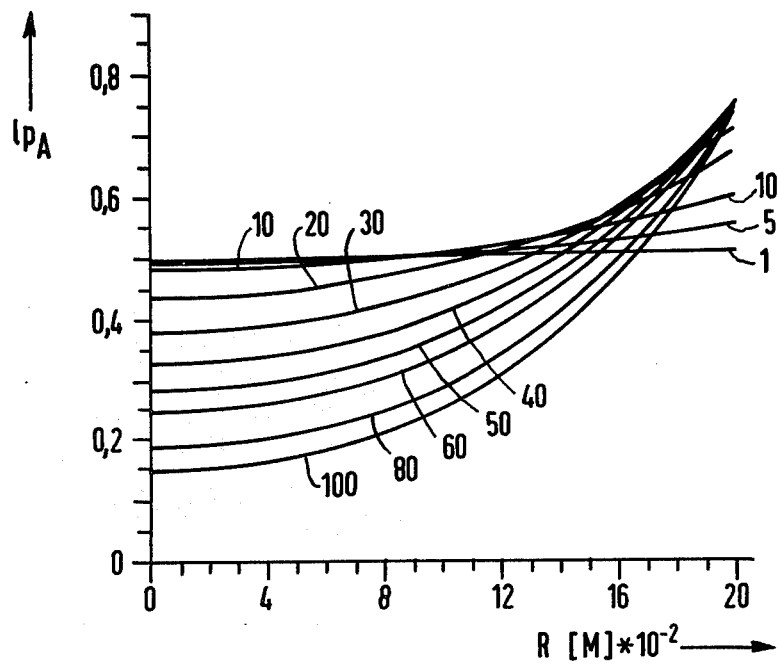
FIGS. 7 and 8 are graphs which are useful in explaining the operation of the invention.

FIG. 7 shows a relative component $1_{PBw}/B_1$ plotted on the ordinate as the amplitude $1_{PA}$, where $1_{PBw}$ is the amplitude of the component rotating with an angular frequency $\omega_1$ of the linearly polarized high-frequency field, and $B_1$ is the amplitude of the external homogeneous alternating field in the x-direction in the absence of a conducting body to be examined. A cylinder having a radius R of 0.2 m, and a conductivity $\delta = 0.5$ [ohm·m]$^{-1}$ is assumed as the body to be examined. Since the linearly polarized high-frequency field is dependent upon the cylinder coordinate $\phi$ there is also assumed to be an intersection angle $\phi$ of 45° which is inclined against the x-axis of the reference vector because, for this angle, the radial reduction of the amplitude is steepest. In the diagram, curves are shown for different frequencies in MHz. As may be seen from the diagram, the amplitude of the effective field strength in the center of the chosen cylinder is only 67% of the value at the edge for a frequency of, for example, 20 MHz. This means, however, that the variation of the field strength with respect to the angle $\phi$ of the cylindrical body can produce considerable signal, and therefore, corresponding image disturbances.

Figure 8:
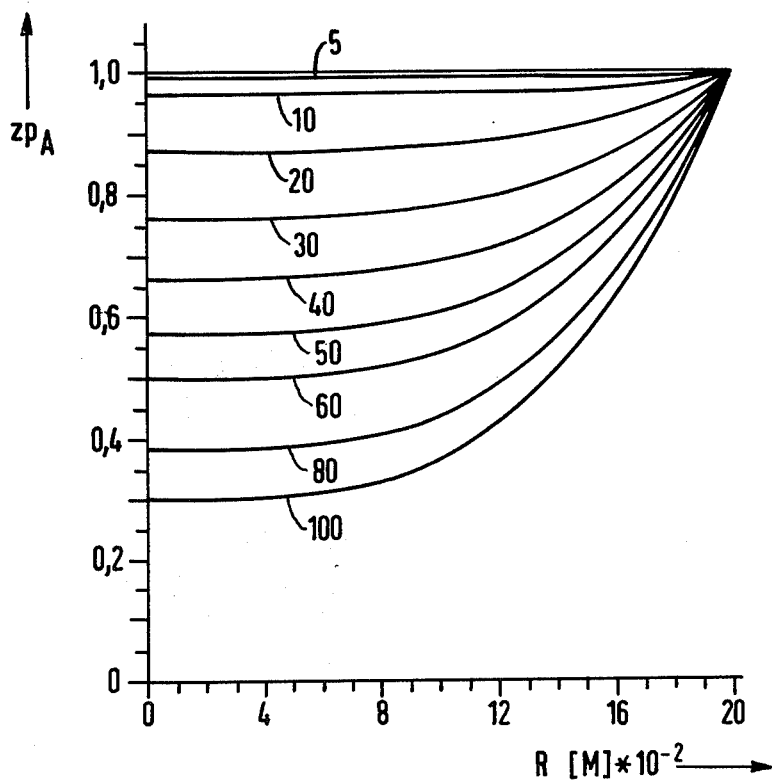

In accordance with the invention, a further coil pair is therefore provided which additionally generates a homogeneous alternating field in the y-direction. This further coil pair, in accordance with the invention, is supplied with a current having the same magnitude as the current flowing through the first coil pair, but which is shifted in phase by 90°. Such combination of currents produce, in outer space, a circularly polarized magnetic field in the absence of a conducting body. In order to excite the nuclear spin magnetization, only the component $z_{PBw}$ which rotates with the frequency $\omega$ is effective. However, in contrast to the known, linearly polarized high-frequency fields, the magnitude of this component is not dependent on the cylinder coordinate $\phi$. In the diagram of FIG. 8, the absolute value $z_{PBw}$ is normalized with respect to the quantity $B_1$ which is graphically shown as the amplitude $z_{PA}$ as a function of the radius R for different frequencies. Except for the different high-frequency field, the same assumptions as in the embodiment example according to the diagrams of FIG. 7 are made. As may be seen from the diagram of FIG. 8, the amplitude of the rotating component drops only to a value of 87% of the edge value for a frequency of 20 MHz. This means that the spatial variation of the effective rotating high-frequency component has been reduced substantially by the invention. As a result of the circularly polarized high-frequency field of the inventive magnet system, an improved penetration behavior of the effective rotating high-frequency component is therefore achieved over a linearly polarized field.

Although the invention has been disclosed in terms of specific embodiments and applications, it is to be understood that persons skilled in the art, in light of this teaching, can generate additional embodiments without exceeding the scope or departing from the spirit of the claimed invention. Accordingly, the drawings and descriptions in this disclosure are proffered to facilitate comprehension of the invention, and should not be construed to limit the scope thereof.

What is claimed is:

1. A magnet system for generating a high-frequency field in an image-generating apparatus of the type which utilizes nuclear magnetic resonance technology, the magnet system being of the type having a first pair of magnet coils which are arranged on an imaginary cylindrical surface and adapted to receive a first high-frequency current for responsively generating a substantially homogeneous high-frequency field which is directed radially with respect to a central longitudinal axis of the imaginary cylindrical surface, the magnet system further comprising at least a second pair of magnet coils which are arranged on at least one imaginary cylindrical surface and adapted to receive a second high-frequency current which is shifted in phase with respect to the first high-frequency current by a predetermined phase angle, the first and second high-frequency currents having substantial equal amplitudes, for responsively producing a circularly polarized high-frequency field.

2. The magnet system of claim 1 wherein the magnet coils of the first and second pairs of magnet coils are shaped in the form of a saddle.

3. The magnet system of claim 1 or 2 wherein there is further provided a hollow cylindrical carrier body, wherein the first and said second pairs of magnet coils are arranged respectively on an inside and an outside surface of said carrier body.

4. The magnet system of claim 3 wherein said magnet coils each have a radial aperture angle which is approximately 120°.

5. The magnet system of claim 3 wherein said radial aperture angle of each magnet coil is approximately 90°.

6. The magnet system of claim 5 wherein adjacent ones of said saddle shaped magnet coils from different ones of the magnet coil pairs are arranged so that respective sides of the coils which face each other have common straight conductor sections extending in a direction which is substantially parallel to the central longitudinal axis, said coils having at their end faces bent conductor sections which are designed to form respective closed rings.

* * * * *